US008097397B2

(12) United States Patent
Takayama et al.

(10) Patent No.: US 8,097,397 B2
(45) Date of Patent: Jan. 17, 2012

(54) MATERIAL FOR FORMATION OF PROTECTIVE FILM, METHOD FOR FORMATION OF PHOTORESIST PATTERN, AND SOLUTION FOR WASHING/REMOVAL OF PROTECTIVE FILM

(75) Inventors: Toshikazu Takayama, Kawasaki (JP); Keita Ishiduka, Kawasaki (JP); Hideo Hada, Kawasaki (JP); Shigeru Yokoi, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 253 days.

(21) Appl. No.: 12/441,514

(22) PCT Filed: Sep. 13, 2007

(86) PCT No.: PCT/JP2007/067887
§ 371 (c)(1),
(2), (4) Date: Mar. 16, 2009

(87) PCT Pub. No.: WO2008/035620
PCT Pub. Date: Mar. 27, 2008

(65) Prior Publication Data
US 2010/0086879 A1 Apr. 8, 2010

(30) Foreign Application Priority Data

Sep. 20, 2006 (JP) ................... 2006-254475
Oct. 6, 2006 (JP) ................... 2006-274825
Dec. 15, 2006 (JP) ................... 2006-338855

(51) Int. Cl.
G03F 7/00 (2006.01)
G03F 7/004 (2006.01)
G03F 7/26 (2006.01)
G03F 7/40 (2006.01)

(52) U.S. Cl. .................. 430/270.1; 430/273.1; 430/311; 430/331; 430/905; 430/945

(58) Field of Classification Search ............... 430/270.1, 430/273.1, 311, 331, 905, 945
See application file for complete search history.

(56) References Cited

U.S. PATENT DOCUMENTS

| 4,806,452 | A |   | 2/1989  | Hoffmann et al. |           |
|-----------|---|---|---------|-----------------|-----------|
| 4,910,122 | A |   | 3/1990  | Arnold et al.   |           |
| 5,707,784 | A |   | 1/1998  | Oikawa et al.   |           |
| 6,004,720 | A | * | 12/1999 | Takechi et al.  | 430/270.1 |
| 6,344,304 | B1| * | 2/2002  | Takechi et al.  | 430/270.1 |
| 6,790,589 | B2| * | 9/2004  | Takechi et al.  | 430/270.1 |
| 7,122,292 | B2| * | 10/2006 | Sumida et al.   | 430/270.1 |
| 2005/0233254 | A1 | * | 10/2005 | Hatakeyama et al. | 430/311 |
| 2006/0141400 | A1 |   | 6/2006  | Hirayama et al.   |         |
| 2006/0275704 | A1 | * | 12/2006 | Hinsberg, III     | 430/273.1 |
| 2007/0105044 | A1 | * | 5/2007  | Maeda et al.      | 430/270.1 |
| 2007/0122736 | A1 | * | 5/2007  | Hatakeyama et al. | 430/270.1 |
| 2009/0142714 | A1 | * | 6/2009  | Ito et al.        | 430/326 |
| 2010/0151395 | A1 | * | 6/2010  | Ishiduka et al.   | 430/325 |

FOREIGN PATENT DOCUMENTS

| JP | S60-38821     | 2/1985  |
| JP | S62-160446    | 7/1987  |
| JP | H03-222409    | 10/1991 |
| JP | H04-55323 B   | 9/1992  |
| JP | H06-95397     | 4/1994  |
| JP | 2005-264131   | 9/2005  |
| KR | 2005-106441   | 11/2005 |
| WO | WO 2004/068242 | 8/2004 |
| WO | WO 2004/074937 | 9/2004 |

OTHER PUBLICATIONS

J.A. Hoffnagle, W.D. Hinsberg, M. Sanchez, and F.A. Houle, "Liquid immersion deepultraviolet interferometric lithography," Journal of Vacuum Science & Technology B, vol. 17, No. 6, American Vacuum Society, Nov./Dec. 1999, pp. 3306-3309.

M. Switkes and M. Rothschild,"Immersion lithography at 157 nm," Journal of Vacuum Science & Technology B, vol. 19, No. 6, American Vacuum Society, Nov./Dec. 2001, pp. 2353-2356.

M. Switkes and M. Rothschild,"Resolution Enhancement of 157 nm Lithography by Liquid Immersion," Proceedings of SPIE vol. 4691, 2002, pp. 459-465.

The International Search Report for corresponding PCT Application No. PCT/JP2007/067887, dated Oct. 16, 2007.

Notice of Reasons for Rejection issued to KR Application No. 10-2009-7004734, mailed Jan. 17, 2011.

* cited by examiner

*Primary Examiner* — Amanda C. Walke
(74) *Attorney, Agent, or Firm* — Knobbe Martens Olson & Bear LLP

(57) ABSTRACT

Disclosed are: a material for forming a protective film to be laminated on a photoresist film, which can prevent the contamination of an exposing device with an outgas generated from the photoresist film, which has little influence on the environment, which has a high water repellent property, which sparingly causes mixing with the photoresist film, and which can form a high-resolution photoresist pattern; a method for forming a photoresist pattern; and a solution for washing/removing a protective film. Specifically disclosed are: a material for forming a protective film, which comprises (a) a non-polar polymer and (b) a non-polar solvent; a method for forming a photoresist pattern by using the material; and a solution for washing/removing a protective film, which is intended to be used in the method.

14 Claims, No Drawings

MATERIAL FOR FORMATION OF PROTECTIVE FILM, METHOD FOR FORMATION OF PHOTORESIST PATTERN, AND SOLUTION FOR WASHING/REMOVAL OF PROTECTIVE FILM

RELATED APPLICATIONS

This application is the U.S. National Phase filing under 35 U.S.C. §371 of PCT/JP2007/067887, filed Sep. 13, 2007, which designated the United States and was published in a language other than English, which claims priority under 35 U.S.C. §119(a)-(d) to Japanese Patent Application No. 2006-254475, filed Sep. 20, 2006; Japanese Patent Application No. 2006-274825, filed Oct. 6, 2006; and Japanese Patent Application No. 2006-338855, filed Dec. 15, 2006. The contents of these applications are incorporated herein by reference in their entireties.

TECHNICAL FIELD

The present invention relates to a material for forming a protective film on a photoresist film, a method for forming a photoresist pattern using the material for forming the protective film, and a solution for washing/removing the protective film used in the method for forming the photoresist pattern.

The material for forming the protective film in the present invention includes at least the material for forming the protective film used in an ordinary dry exposure process and the material for forming the protective film used in a liquid immersion exposure process.

Here, the material for forming the protective film used in the above ordinary dry exposure process is mainly a material for forming a protective film used for the purpose of preventing an outgas generated from the photoresist film when a pattern is formed by a photolithographic technique. Further, the material for forming the protective film used in the above liquid immersion exposure process is a material for forming a protective film suitable for being used in the liquid immersion exposure process in which resolution of the photoresist pattern is enhanced by interposing a liquid, having a predetermined thickness and a refractive index which is higher than that of air and lower than that of the photoresist film, at least on the photoresist film in a path where a lithographic exposure light is incident to the photoresist film, and exposing the photoresist film in this state.

BACKGROUND ART

Firstly, background art concerning the material for forming the protective film used in the dry exposure process will be discussed.

It has been conventionally known that a problem referred to as a stationary wave effect due to multiple interference occurs when a pattern is formed by exposing a photoresist film. That is, a phenomenon that an exposure light is transmitted through the photoresist film, and the transmitted light is reflected on an underlayer surface and a part of the reflected light is reflected on an upper surface of the photoresist film, the reflection being further repeated in the photoresist film.

The multiple interference by the light is attributed to interference of an irradiated light at a single wavelength, which has entered the photoresist film formed on the substrate, with the reflected light from the substrate, and light energy amounts absorbed in a thickness direction of the photoresist film are different. Variation in film thickness of the photoresist film affects a size width of the resist pattern obtained after development, resulting in reducing the accuracy of the size of the photoresist pattern.

This reduction in accuracy becomes a large problem because the film thickness of the photoresist film is different in concavoconvex portions, particularly when a fine pattern is formed on a substrate having different heights. Thus, it has been desired to develop technology in which the above interference effect is eliminated and the accuracy of the size of the resist pattern is not reduced even in a fine pattern formed on a substrate having different heights.

Consequently, a method in which a resin composition containing a material having a property of absorbing exposed light, applied on a semiconductor substrate to form an underlayer film (anti-reflection film) before forming a photoresist film on the substrate and the photoresist film is formed on the underlayer film (see Patent Document 1); and a method in which a water-soluble resin film of polysiloxane or polyvinyl alcohol as an anti-reflection film is formed on a photoresist film provided on a substrate (see Patent Documents 2 and 3) have been employed conventionally.

Next, background art concerning the material for forming the protective film used in the liquid immersion exposure process will be discussed.

In recent years, the liquid immersion exposure process has been reported as a new lithographic technique (see Non-patent Documents 1 to 3). In this liquid immersion exposure process, a conventional exposure light path space is replaced with a so-called liquid for liquid immersion exposure (e.g., pure water and a fluorine-based inert liquid and the like). Thereby, it is possible to realize the formation of a photoresist pattern having a higher resolution and an excellent focal depth even using a light source having the same exposure wavelength (see Patent Documents 4 to 6).

Technology which aims at simultaneously preventing alteration of the photoresist film due to the liquid for the liquid immersion exposure and variation in refractive index by using the protective film using a resin capable of being dissolved in only a particular solvent has been proposed (see Patent Document 5).

More recently, technology in which removing the protective film and forming the photoresist pattern are simultaneously performed upon alkali development after the liquid immersion exposure by using an alkali-soluble protective film has been proposed in terms of simplifying a resist pattern formation process and enhancing production efficiency (see Patent Document 6).

Non-Patent Document 1: Journal of Vacuum Science & Technology B (Published in U.S.A.), vol. 17, No. 6, pp. 3306-3309, 1999.

Non-Patent Document 2: Journal of Vacuum Science & Technology B (Published in U.S.A.), vol. 19, No. 6, pp. 2353-2356, 2001.

Non-Patent Document 3: Proceedings of SPIE (Published in U.S.A.), Vol. 4691, pp. 459-465, 2002.

Patent Document 1: U.S. Pat. No. 4,910,122

Patent Document 2: Japanese Patent Application, Publication No. H4-55323

Patent Document 3: Japanese Unexamined Patent Application, Publication No. H3-222409

Patent Document 4: PCT International Publication No. WO 2004/068242

Patent Document 5: PCT International Publication No. WO 2004/074937

Patent Document 5: Japanese Unexamined Patent Application, Publication No. 2005-264131

DISCLOSURE OF THE INVENTION

Problems to be Solved by the Invention

However, regarding the protective films (anti-reflection film) described in the above Patent Documents 1 to 3, there have been problems in that, depending on the constituting materials, acidity may increase to adversely affect properties of the photoresist film and that contamination of an exposure device with an outgas generated from the photoresist film can not be prevented completely.

In the protective film described in the above Patent Document 5, a fluorine-based specific solvent is required. This fluorine-based specific solvent has a problem in that its potential contribution to global warming is high which greatly affects the environment.

The protective film disclosed in the above Patent Document 6 has a problem in forming the photoresist pattern of desired resolution because mixing with the photoresist film in the underlayer occurs in some cases.

In view of the above problems, it is an object of the present invention to provide a material for forming a protective film which does not deteriorate the properties of the photoresist film and can effectively prevent an outgas from being generated in the photoresist film when used in the dry exposure process, and which has little influence on the environment, has a high water repellent property, sparingly causes mixing with the photoresist film and can form a high resolution photoresist pattern when used in the liquid immersion exposure process. Also, it is another object of the present invention to provide a method for forming a photoresist pattern using a protective film formed by the material for forming the protective film, and a solution for washing/removing the protective film.

Means for Solving the Problems

The present inventors have found that the above objects can be accomplished by using a material for forming a protective film, which contains a non-polar polymer and a non-polar solvent, and completed the present invention.

The present invention provides the material for forming the protective film to be laminated on a photoresist film, containing (a) the non-polar polymer and (b) the non-polar solvent.

Also, the present invention provides a method for forming a photoresist pattern, the method including the steps of:
(1) providing a photoresist film on a substrate,
(2) forming a protective film on this photoresist film using a material for forming the protective film,
(3) selectively exposing the photoresist film through the protective film,
(4) removing the protective film using a solution for washing/removing the protective film, containing a non-polar organic solvent, and
(5) developing the photoresist film using an alkali developer.

Also, the present invention provides a method for forming a photoresist pattern using a liquid immersion exposure process, the method including the steps of:
(1) providing a photoresist film on a substrate,
(2) forming a protective film on this photoresist film using the material for forming the protective film,
(3) disposing a liquid for a liquid immersion exposure at least on the protective film on the substrate and selectively exposing the photoresist film through this liquid for the liquid immersion exposure and the protective film,
(4) removing the protective film using a solution for washing/removing the protective film, containing a non-polar organic solvent, and
(5) developing the photoresist film using an alkali developer.

Furthermore, the present invention provides a solution for washing/removing a protective film, in which the solution for washing/removing the protective film is at least one selected from hydrocarbon-based solvents.

Effects of the Invention

According to the present invention, concerning the material for forming the protective film used in the dry exposure process, it becomes possible to effectively prevent the outgas generated from the photoresist film without causing deterioration in properties of the photoresist film. Concerning the material for forming the protective film used in the liquid immersion exposure process, it becomes possible to form a resist pattern which has little influence on the environment, has a high water repellent property, sparingly causes mixing with the photoresist film and has high resolution. By forming the photoresist pattern using the protective film, it becomes possible to form a photoresist pattern having a higher resolution than conventional photoresist pattern.

PREFERRED MODE FOR CARRYING OUT THE INVENTION

The material for forming the protective film according to the present invention contains (a) a non-polar polymer (hereinafter also referred to as component (a)) and (b) a non-polar solvent (hereinafter also referred to as component (b)).

(a) Non-Polar Polymer

The non-polar polymer (a) refers to polymers having no polar group (—OH, —NO$_2$, —CO, —NH$_2$, —O—CH$_3$) in their molecule. By having no polar group in the molecule, it becomes possible to impart the water repellent property to the polymer.

As a first aspect of the non-polar polymer (a), a polymer having a monomer unit represented by the following general formula (A-1) as a constitutional unit can be used.

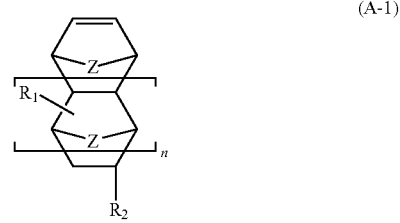

(A-1)

[In the formula, R$_1$ is a hydrogen atom, or an alkyl group having 1 to 6 carbon atoms (where a portion of or all of the hydrogen atoms in the alkyl group may be substituted with fluorine atoms), R$_2$ is a hydrogen atom, or a straight chain, branched chain or cyclic alkyl group having 1 to 6 carbon atoms (where a portion of or all of the hydrogen atoms in the alkyl group may be substituted with fluorine atoms), Z is an alkylene chain having 1 to 2 carbon atoms or an oxygen atom, and n is an integer of 0 to 3.]

In particular, the alkyl groups of R$_1$ and R$_2$ specifically include straight chain alkyl groups such as methyl, ethyl, n-propyl, n-butyl and n-pentyl, branched chain alkyl groups such as isopropyl, 1-methylpropyl, 2-methylpropyl and tert-butyl, and cyclic alkyl groups such as cyclopentyl and cyclohexyl. A portion of or all of the hydrogen atoms in these alkyl groups may be substituted with the fluorine atoms.

Furthermore, in the above general formula (A-1), Z is preferably a methylene chain and n is preferably 0.

The non-polar polymer (a) according to the present invention may be a homopolymer composed of the monomer unit represented by the above general formula (A-1), or may be a copolymer which polymerizes with multiple monomers having different substituents or polymerizes with another non-polar polymer.

Such a non-polar polymer (a) can be synthesized by publicly known methods. A mass average molecular weight (Mw) of this polymer in terms of polystyrene by GPC is not particularly limited, but is 2,000 to 80,000 and more preferably 3,000 to 50,000.

Furthermore, amount of the non-polar polymer (a) to be blended is preferably about 1 to 20% by mass and more preferably 0.3 to 10% by mass based on a total amount of the material for forming the protective film.

As an additional aspect of the non-polar polymer (a), cyclic olefin-based polymers and copolymers other than those described above can be used.

Such cyclic olefin-based polymers and copolymers other than those described above include, for example, Apel series (brand name, supplied from Mitsui Chemicals Inc.), ZEONOR series, ZEONE series (supplied from Zeon Corporation) and TOPA series (supplied from TICONA) in commercially available articles.

(b) Non-Polar Solvent

The non-polar solvent (b) is not particularly limited as long as it can dissolve the above component (a), does not react with the photoresist film and has little influence on the environment, but hydrocarbon-based solvents are preferable.

The hydrocarbon-based solvent includes, for example, hydrocarbons such as hexane, heptane, octane, nonane, methyloctane, decane, undecane, dodecane and tridecane, branched chain hydrocarbons having 3 to 15 carbon atoms, aromatic hydrocarbons such as benzene, toluene and diethylbenzene, and hydrocarbons such as terpene-based solvents having a cyclic skeleton. These can be used alone or in a mixture of two or more.

Among such hydrocarbon-based solvents, it is preferable to use the terpene-based solvent which is hydrocarbon having the cyclic skeleton. Such a terpene-based solvent specifically includes monoterpenes such as geraniol, nerol, linalool, citral, citronellol, p-menthane, o-menthane, m-menthane, diphenylmenthane, menthol, isomenthol, neomenthol, limonene, α-terpinene, β-terpinene, γ-terpinene, α-terpineol, β-terpineol, γ-terpineol, terpinene-1-ol, terpinene-4-ol, 1,4-terpin, 1,8-terpin, carvone, ionone, thujone, camphor, bornane, borneol, norbornane, pinane, α-pinene, β-pinene, thujane, α-thujone, β-thujone, carane, camphor, longiforene, 1,4-cineol and 1,8-cineol, and diterpenes such as abietane and abietic acid. Among such terpene-based solvents, monoterpenes are preferable because they are easily available, and among these, at least one selected from limonene, pinene and p-menthane is preferable due to their high dissolution capacity.

Method For Forming Photoresist Pattern

The methods for forming the photoresist pattern according to the present invention are classified into the method for forming the photoresist pattern by the dry exposure process and the method for forming the photoresist pattern by the liquid immersion exposure process.

The method for forming the photoresist pattern by the liquid immersion exposure process according to the present invention includes the steps of:

(1) providing a photoresist film on a substrate (hereinafter also referred to as step (1)), (2) forming a protective film on the photoresist film using the material for forming the protective film (hereinafter also referred to as step (2)), (3) disposing a liquid for a liquid immersion exposure at least on the protective film on the substrate and selectively exposing the photoresist film through the liquid for the liquid immersion exposure and the protective film (hereinafter also referred to as step (3)), (4) removing the protective film using a solution for washing/removing the protective film, containing a non-polar organic solvent (hereinafter also referred to as step (4)), and (5) developing the photoresist film using an alkali developer (hereinafter also referred to as step (5)).

The step (1) is a step of providing the photoresist film on the substrate. Specifically, the publicly known photoresist composition is applied on a substrate of a silicon wafer and the like using a publicly known method such as a spinner followed by giving a prebaking (PAB treatment) to form the photoresist film. The photoresist film may be formed after one layer of an organic or inorganic anti-reflection film (underlayer anti-reflection film) is provided.

The step (2) is a step of forming the protective film on the photoresist film. Specifically, the protective film is formed by uniformly applying the material for forming the protective film according to the present invention, which has been prepared at a predetermined concentration on the formed photoresist film by the same method as in the step (1) and baking to cure.

The step (3) is a step of disposing the liquid for the liquid immersion exposure on the protective film and in this state, selectively exposing the photoresist film and the protective film on the substrate through a mask pattern. An exposure light passes through the liquid for the liquid immersion exposure and the protective film to attain the photoresist film.

At that time, the photoresist film is blocked by the protective film from the liquid immersion medium. Thus preventing invasion of the liquid immersion medium into the resist film causing alterations such as swelling, or conversely, preventing elution of the component into the liquid immersion medium altering the optical property such as the refractive index of the liquid immersion medium itself.

The exposure light is not particularly limited as is the case with the dry exposure process, and radiation such as ArF excimer laser, KrF excimer laser, EUV and VUV (vacuum ultraviolet light) can be used.

The liquid for the liquid immersion exposure is not particularly limited as long as it is a liquid having a refractive index which is larger than that of the air and is smaller than that of the photoresist film to be used. Such a liquid for the liquid immersion exposure includes water (pure water, deionized water) and fluorine-based inert liquids, and it is possible to use the liquid for the liquid immersion exposure having a high refractive index property, which is anticipated to be developed in the near future. Specific examples of the fluorine-based inert liquid include liquids composed mainly of a fluorine-based compound such as $C_3HCl_2F_5$, $C_4F_9OCH_3$, $C_4F_9OC_2H_5$ and $C_5H_3F_7$. Among such liquids for the liquid immersion exposure, in terms of cost, safety, environmental problems and versatility, it is preferable to use water (pure water, deionized water).

When the exposure step in the liquid immersion step is complete, the substrate is taken out from the liquid for the liquid immersion exposure and the liquid is removed from the substrate.

The step (4) is a step of providing a heating treatment if necessary as the protective film is laminated on the photoresist film after the exposure in the step (3), and removing the protective film using the solution for washing/removing the protective film using the non-polar organic solvent described later.

By separately providing the step of removing the protective film using the non-polar organic solvent in this way, it becomes possible to remove a mixing layer using the non-polar organic solvent even if the mixing layer has been formed by the mixing of the protective film with the photoresist film.

The step (5) is a step of developing the photoresist film using the alkali developer. The alkali developer can be appropriately selected for use from publicly known developers. Since the protective film has been removed in the above step (4), the photoresist film is removed by this developer. Following the development, a post-baking may be performed.

Subsequently, the resist film is rinsed by using pure water or the like. In this rinse with water, the developer and protective film components and the resist composition dissolved by this developer on the substrate are washed out, for example, by dropping or spraying the water on the substrate surface with rotating the substrate. Then, a photoresist pattern, in which the photoresist film is patterned in a shape corresponding to a mask pattern, is obtained by drying.

In the protective film formed from the material for forming the protective film according to the present invention, the water repellent property is enhanced. Thus, the liquid for the liquid immersion exposure is easily separated after completing the exposure, the amount of the adhered liquid for the liquid immersion exposure is small and a so-called leakage of the liquid for the liquid immersion exposure is reduced.

Further, the method for forming the photoresist pattern by the dry exposure process according to the present invention is common to the method by the liquid immersion exposure process except that no liquid for the liquid immersion exposure is used.

By the protective film formed from the material for forming the protective film according to the present invention, deterioration in the properties of the photoresist film does not occur and the outgas generated from the photoresist film can be effectively prevented in the dry exposure process. In particular, conventional protective film absorbs EUV exposure light, whereas the protective film formed from the material for forming the protective film according to the present invention does not absorb the EUV exposure light, can prevent the outgas generated from the photoresist film and can prevent the contamination of the exposure device. Thus, the material for forming the protective film according to the present invention is particularly useful for the dry exposure process using EUV as the exposure light.

Solution for Washing/Removing the Protective Film

The solution for washing/removing the protective film according to the present invention is not particularly limited as long as it contains the non-polar organic solvent and can dissolve the protective film formed from the material for forming the protective film according to the present invention. Specifically, the hydrocarbon-based solvent is preferably contained.

The hydrocarbon-based solvent includes, for example, hydrocarbons such as hexane, heptane, octane, nonane, methyloctane, decane, undecane, dodecane and tridecane, branched chain hydrocarbons having 3 to 15 carbon atoms, aromatic hydrocarbons such as benzene, toluene and diethylbenzene, and hydrocarbons such as terpene-based solvents having a cyclic skeleton. These can be used alone or in a mixture of two or more.

Among such hydrocarbon-based solvents, it is preferable to use the terpene-based solvent which is a hydrocarbon having a cyclic skeleton. Such a terpene-based solvent specifically includes monoterpenes such as geraniol, nerol, linalool, citral, citronellol, p-menthane, o-menthane, m-menthane, diphenylmenthane, menthol, isomenthol, neomenthol, limonene, α-terpinene, β-terpinene, γ-terpinene, α-terpineol, β-terpineol, γ-terpineol, terpinene-1-ol, terpinene-4-ol, 1,4-terpin, 1,8-terpin, carvone, ionone, thujone, camphor, bornane, borneol, norbornane, pinane, α-pinene, β-pinene, thujane, α-thujone, β-thujone, carane, camphor, longiforene, 1,4-cineol and 1,8-cineol, and diterpenes such as abietane and abietic acid. Among such terpene-based solvents, monoterpenes are preferable because they are easily available, and among these, at least one selected from limonene, pinene and p-menthane is preferable due to their high dissolution capacity.

Furthermore, a publicly known surfactant and the like may be appropriately blended to an extent that the property of the solution for washing/removing the protective film according to the present invention is not impaired.

Photoresist Composition

The photoresist composition is not particularly limited, and any photoresist composition capable of being developed in an alkali aqueous solution including negative and positive type photoresist compositions can be used. Such a photoresist composition includes, but is not limited to, (i) positive type photoresist compositions containing a naphthoquinone diazide compound and a novolak resin, (ii) positive type photoresist compositions containing a compound which generates the acid by the exposure, a compound which decomposes by the acid to increase the solubility in the alkali aqueous solution and an alkali-soluble resin, (iii) positive type photoresist compositions containing a compound which generates the acid by the exposure and an alkali-soluble resin having a group which decomposes by the acid to increase the solubility in the alkali aqueous solution, and (iv) negative type photoresist compositions containing a compound which generates the acid by the light, a crosslinking agent and an alkali-soluble resin.

EXAMPLES

Example 1

A material 1 for forming a protective film at a solid content of 1.5% by mass was prepared by dissolving a non-polar polymer (mass average molecular weight: 12,000) having a monomer unit represented by the following structural formula (X-1) as a constitutional unit in p-menthane.

(X-1)

Then, TArF-6a239 (supplied from Tokyo Ohka Kogyo Co., Ltd.), which is a resist material containing an acrylic resin, was applied on a substrate on which ARC29 (supplied from Brewer Co., Ltd.) having a film thickness of 77 nm had been formed, and heated at 120° C. for 60 seconds to form a photoresist film having a film thickness of 150 nm. Further, the material 1 for forming the protective film was applied thereon and heated at 90° C. for 60 seconds to form a protective film having a film thickness of 35 nm.

The substrate underwent pattern exposure using an exposing device NSR-S302A (supplied from Nikon Corporation), and heating was performed at 110° C. for 60 seconds after the exposure. Then, the protective film was removed using p-menthane. Subsequently, a photoresist pattern was formed by developing in an aqueous solution of 2.38% by mass of tetramethylammonium hydroxide for 30 seconds and giving a rinsing treatment. As a result of observing the thus formed photoresist pattern using SEM (scanning electron microscope), a pattern shape was a good rectangular shape.

Comparative Example 1

A material 2 for forming a protective film at a solid content of 1.5% by mass was prepared by dissolving an alkali-soluble polymer (mass average molecular weight: 5,000) represented by the following general formula (X-2) in dibutyl ether.

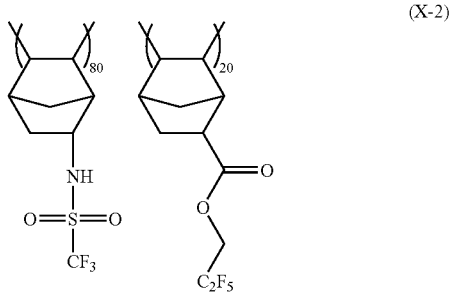

Then, TArF-6a239 (supplied from Tokyo Ohka Kogyo Co., Ltd.), which is a resist material containing an acrylic resin, was applied on a substrate on which ARC29 (supplied from Brewer Co., Ltd.) having a film thickness of 77 nm had been formed, and heated at 120° C. for 60 seconds to form a photoresist film having a film thickness of 150 nm. Further, the material 2 for forming the protective film was applied thereon and heated at 90° C. for 60 seconds to form a protective film having a film thickness of 35 nm.

The substrate underwent pattern exposure using an exposing device NSR-S302A (supplied from Nikon Corporation), and heating was performed at 110° C. for 60 seconds after the exposure. Then, the protective film was removed using p-menthane. Subsequently, the photoresist pattern was formed by developing in an aqueous solution of 2.38% by mass of tetramethylammonium hydroxide for 30 seconds and giving a rinsing treatment. As a result of observing the thus formed photoresist pattern using SEM (scanning electron microscope), regarding pattern shape, a top portion of the pattern was a T-top shape.

Examples 2 to 9 and Comparative Example 2

A material for forming a protective film at a solid content of 1.2% by mass was prepared by dissolving the non-polar polymer shown in Table 1 in p-menthane.

Then, TDUR-P628 (supplied from Tokyo Ohka Kogyo Co., Ltd.), which is a photoresist for KrF containing a polyhydroxystyrene resin, was applied on a 6-inch silicon wafer and heated at 130° C. for 90 seconds to form a photoresist film having a film thickness of 800 nm. Further, the material for forming the protective film prepared above was applied thereon and heated at 90° C. for 90 seconds to form a protective film having a film thickness of 30 nm.

The above each silicon wafer was placed in an exposing device (VUVES-4500, supplied from Lithotec Japan Co.) Furthermore, a nitrogen gas at a flow rate of $1.0 \, L/cm^2$ was run from an inlet of the exposure device, the nitrogen gas discharged from an outlet was trapped by a trapping device "Automated Thermal Desorber Turbo Matrix ATD (supplied from Perkin Elmer Instruments Co., Ltd.) [trapping tube TenaxTA: supplied from SUPELCO Co.]", and the amount of thioanisole in trapped gas components was measured. The amount of detected thioanisole was shown as a relative ratio when the amount of thioanisole in Comparative Example 2 in which no protective film had been provided was 100%. Results are shown in TABLE 1.

TABLE 1

|  | Non-polar polymer | Amount of detected thioanisole |
| --- | --- | --- |
| Example 2 | APL6013T (supplied from Mitsui Chemicals Inc.) | 15.1% |
| Example 3 | APL5014DT (supplied from Mitsui Chemicals Inc.) | 17.0% |
| Example 4 | APL6015T (supplied from Mitsui Chemicals Inc.) | 17.0% |
| Example 5 | Zennor1020R (supplied from Zeon Corporation) | 62.3% |
| Example 6 | TOPAS8008 (supplied from TICONA) | 18.5% |
| Example 7 | TOPAS5013 (supplied from TICONA) | 10.0% |
| Example 8 | TOPAS6013 (supplied from TICONA) | 18.5% |
| Example 9 | Resin used in Example 1 | 45.5% |
| Comparative Example 2 | No protective film | 100% |

From the results in the above Table 1, it has been found that the generation of outgas can be prevented in cases where there is provided the protective film formed from the material for forming the protective film according to the present invention.

The invention claimed is:

1. A material for forming a protective film to be laminated on a photoresist film, comprising (a) a non-polar polymer and (b) a non-polar solvent.

2. The material for forming the protective film according to claim 1, wherein said non-polar polymer (a) is a polymer having a monomer unit represented by the following general formula (A-1) as a constitutional unit

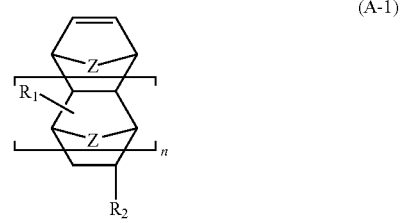

[wherein, R1 is a hydrogen atom, or an alkyl group having 1 to 6 carbon atoms (where a portion of or all of the hydrogen atoms in the alkyl group may be substituted with fluorine atoms), R2 is hydrogen atom, or a straight chain, branched chain or cyclic alkyl group having 1 to 6 carbon atoms (where a portion of or all of the hydrogen atoms in the alkyl group may be substituted with fluorine atoms), Z is an alkylene chain having 1 to 2 carbon atoms or an oxygen atom, and n is an integer of 0 to 3].

3. The material for forming the protective film according to claim 1, wherein said non-polar solvent (b) is at least one selected from hydrocarbon-based solvents.

4. The material for forming the protective film according to claim 3, wherein said hydrocarbon-based solvent is at least one selected from terpene-based solvents.

5. A method for forming a photoresist pattern, comprising the steps of:
 (1) providing a photoresist film on a substrate;
 (2) forming a protective film on the photoresist film using the material for forming the protective film according claim 1;
 (3) selectively exposing said photoresist film through said protective film;
 (4) removing said protective film using a solution for washing/removing the protective film, containing a non-polar organic solvent; and
 (5) developing said photoresist film using an alkali developer.

6. A method for forming a photoresist pattern using a liquid immersion exposure process, comprising the steps of:
 (1) providing a photoresist film on a substrate;
 (2) forming a protective film on the photoresist film using the material for forming the protective film according claim 1;
 (3) disposing a liquid for a liquid immersion exposure at least on said protective film on said substrate and selectively exposing said photoresist film through this liquid for the liquid immersion exposure and said protective film;
 (4) removing said protective film using a solution for washing/removing the protective film, containing a non-polar organic solvent; and
 (5) developing said photoresist film using an alkali developer.

7. The method for forming the photoresist pattern according to claim 5, wherein said solution for washing/removing the protective film is at least one selected from hydrocarbon-based solvents.

8. The material method for forming the photoresist pattern according to claim 7, wherein said hydrocarbon-based solvent is at least one selected from terpene-based solvents.

9. A solution for washing/removing a protective film used in the method for forming the photoresist pattern according to claim 5, wherein said solution for washing/removing the protective film is at least one selected from hydrocarbon-based solvents.

10. The solution for washing/removing the protective film according to claim 9, wherein said hydrocarbon-based solvent is at least one selected from terpene-based solvents.

11. The method for forming the photoresist pattern according to claim 6, wherein said solution for washing/removing the protective film is at least one selected from hydrocarbon-based solvents.

12. The method for forming the photoresist pattern according to claim 11, wherein said hydrocarbon-based solvent is at least one selected from terpene-based solvents.

13. A solution for washing/removing a protective film used in the method for forming the photoresist patter according to claim 6, wherein said solution for washing/removing the protective film is at least one selected from hydrocarbon-based solvents.

14. The solution for washing/removing a protective film according to claim 13, wherein said hydrocarbon-based solvent is at least one selected from terpene-based solvents.

* * * * *